United States Patent [19]

Fischer

[11] 4,069,356

[45] Jan. 17, 1978

[54] METHOD FOR RAPIDLY FORMING PHOTOCONDUCTIVE LAYERS FOR INTEGRATED CIRCUITS

[75] Inventor: Albert G. Fischer, Dortmund-Hombruch, Germany

[73] Assignee: Westinghouse Electric Corporation, Pittsburgh, Pa.

[21] Appl. No.: 643,276

[22] Filed: Dec. 22, 1975

Related U.S. Application Data

[63] Continuation of Ser. No. 499,686, Aug. 22, 1974, abandoned.

[51] Int. Cl.² ............................................. B05D 5/12
[52] U.S. Cl. ...................................... 427/76; 96/1.5; 252/501; 427/74; 427/82; 427/99; 427/248 R; 427/377; 428/209; 428/457; 428/914
[58] Field of Search ............... 427/76, 248 R, 377, 427/372 R, 74, 82, 99, ; 96/1.5; 252/501; 428/195, 209, 457, 901, 914

[56] References Cited

U.S. PATENT DOCUMENTS

| | | | |
|---|---|---|---|
| 2,936,252 | 5/1960 | Hanlet | 427/248 |
| 3,592,643 | 7/1971 | Bartfai | 96/1.5 |
| 3,703,594 | 11/1972 | Shigeaki et al. | 252/501 |
| 3,704,265 | 11/1972 | Nakamura et al. | 252/501 |
| 3,743,609 | 7/1973 | Hirata et al. | 96/1.5 |
| 3,754,985 | 8/1973 | Marlor et al. | 427/74 |

*Primary Examiner*—Cameron K. Weiffenbach
*Attorney, Agent, or Firm*—C. L. Menzemer

[57] ABSTRACT

Photoconductive layers particularly useful with integrated circuits are directly made from compositions selected from the group consisting of zinc sulfide (ZnS), cadmium sulfide (CdS), cadmium selenide (CdSe), cadmium telluride (CdTe), zinc sulfide selenide ($ZnS_xSe_{1-x}$), and cadmium sulfide selenide ($CdS_xSe_{1-x}$), and cadmium sulfide telluride ($CdS_xTe_{1-x}$). Powders of component materials for the photoconductive layer are mixed with a copper halide powder such that the copper halide is between about 0.1 and 5.0% and preferably between about 0.1 and 2.0% by weight of the total mixture. The mixed powder then is formed into at least one pellet and the pellet used as an evaporant source for vacuum deposition of a photoconductive layer onto a prepared substrate at a rate greater than 10 nanometers/minute and preferably greater than 500 nanometers per minute. The photoconductive layer and substrate are then baked in an oxygen-rich atmosphere at a temperature between 300° and 550° C and preferably between 400° and 550° C for as short as about one minute.

6 Claims, 1 Drawing Figure

METHOD FOR RAPIDLY FORMING PHOTOCONDUCTIVE LAYERS FOR INTEGRATED CIRCUITS

CROSS REFERENCE TO RELATED APPLICATION

This is a continuation of application Ser. No. 499,686 filed Aug. 22, 1974, now abandoned.

FIELD OF THE INVENTION

The present invention relates to the making of photoconductive layers for semiconductor devices and particularly for integrated circuits.

BACKGROUND OF THE INVENTION

Photoconductivity is the phenomena evidenced by the increase in electrical conductivity of a material by the absorption of light or other electromagnetic radiation. Although every insulator and semiconductor material exhibits the phenomena of photoconductivity to some degree, there are relatively few materials that give large enough changes in conductivity with illumination as to be useful commercially.

Photoconductive materials found useful for semiconductor devices are zinc sulfide (ZnS), cadmium sulfide (CdS), cadium selenide (CdSe), cadmium telluride (CdTe), zinc sulfide ($ZnS_xSe_{1-x}$), cadmium sulfide selenide ($CdS_xSe_{1-x}$), and cadmium sulfide telluride ($CdS_xTe_{1-x}$). These materials can be made to provide high photoconductivity gain. To provide high photoconductivity gain the material is typically doped with a metal (usually copper) and a halogen (usually chlorine).

Commercial preparation of photoconductive layers of high photoconductivity gain for semiconductor devices has usually involved first depositing the photoconductive material by evaporation in a high vacuum from one or more evaporant sources. The photoconductive is subsequently doped by baking the layer for about one-half hour or more embedded in chlorine- and copper-dopant powder of the same type. Alternatively, the photoconductive material could be doped by spraying on dopant aqueous solutions of, for example, cadmium chloride and selenothiourea in the presence of air with a heated substrate.

The difficulty is that such doping methods are corrosive and are therefore unsuitable for depositing photoconductive layers integrally with integrated circuits. It is very desirable to use photconductive layers, e.g. photosensitive resistors, in integrated circuits to stop and to start the operation of the circuit by a low intensity light beam. In such instances, it has generally been required that the photoconductive layer be separately formed and then applied to the integrated circuit substrate.

One proposal to overcome the difficulty has been to vapor deposit the dopants or compounds thereof sequentially after the photoconductive layer has been deposited, and thereafter to bake the assembly. For example, to make a cadmium sulfide selenide ($CdS_xSe_{1-x}$) layer of high photoconductivity gain, a mixture of cadmium sulfide (CdS) and cadmium (CdSe) is first vapor deposited on a suitable substrate, and then first copper and subsequently cadmium chloride ($CdCl_2$) are sequentially vapor deposited over the cadmium sulfide selenide layer. The dopants are thereafter incorporated into the cadmium sulfide selenide layer by baking the assembled structure for about an hour or more.

This solution to the problem is, however, time consuming and expensive. Low evaporation and deposition rates, i.e. less than about 10 nanometers per minute, are required. Further, the assembly requires baking for extended periods of time to incorporate the dopants into the photoconductive layer.

The present invention overcomes these problems and difficulties. It provides a simplified process for making high gain photoconductive layers where rapid evaporation and deposition rates can be used and only a very brief heating in air is necessary. Further, the invention provides a method for making photoconductive layers and pads directly on integrated circuit substrates, a method that is compatible with thin-film manufacturing techniques.

SUMMARY OF THE INVENTION

A method is provided for making high photoconductivity gain photoconductive layers directly on a substrate. The composition of the photoconductive layer is a copper-halogen doped composition selected from the group consisting of zinc sulfide (ZnS), cadmium sulfide (CdS), cadmium selenide (CdSe), cadmium telluride (CdTe), zinc sulfide selenide ($ZnS_xSe_{1-x}$), cadmium sulfide selenide ($CdS_xSe_{1-x}$), and cadmium sulfide telluride ($CdS_xTe_{1-x}$), $x$ in the above expressions being greater than zero and less than one.

The photoconductive layer is made by first mixing powders of component materials of the photoconductive layer with about 0.1 to 5.0% and preferably about 0.1 to 2.0 percent by weight copper halide and preferably copper chloride. The mixed powder is then formed into cohesive pellets by cold pressing without use of a binder. Subsequently, at least one of the pellets is disposed as an evaporant source in a vacuum chamber in spaced relationship with a substrate prepared for vapor deposition thereon. A partial vacuum typically of less than about $1 \times 10^{-5}$ torr is then drawn on the vacuum chamber.

Vapor is then evaporated from the pellet-evaporant source and deposited on the preferably cold substrate at a rate greater than about 10 nanometers per minute and preferably greater than about 500 nanometers per minute. A photoconductive layer or layers is thus formed on the substrate. Ohmic contacts may then be conveniently applied to the photoconductive layer and substrate by vapor deposition of a suitable metal in the same apparatus from a different evaporant source. Alternatively, the ohmic contacts may be subsequently deposited by vapor or sputter deposition at some later stage in the manufacture of the integrated circuit or other semiconductor device.

In any event, after formation of the photoconductive layer, the photoconductive layer and substrate are baked in an oxygen-rich atmosphere such as stagnant air at between 300° and 550° C and preferably between 400° and 550° C. The baking diffuses some halogen and metal dopant into the crystal structure of the photoconductivity material and allows the excess halogen to escape from the photoconductive layer. The time of baking will vary inversely and exponentially with temperature. Therefore, with the higher temperatures in the range, the baking can be completed in about 1 minute.

Other details, objects and advantages of the invention will become apparent as the following description of the present preferred embodiments thereof and present preferred means for practicing the same proceeds.

BRIEF DESCRIPTION OF THE DRAWING

In the accompanying drawing the present preferred embodiment of the invention is shown, in which:

The FIGURE is a flow chart showing the operational steps in preferred sequence for performance of the invention.

DESCRIPTION OF THE PREFERRED EMBODIMENT

Figure 1:
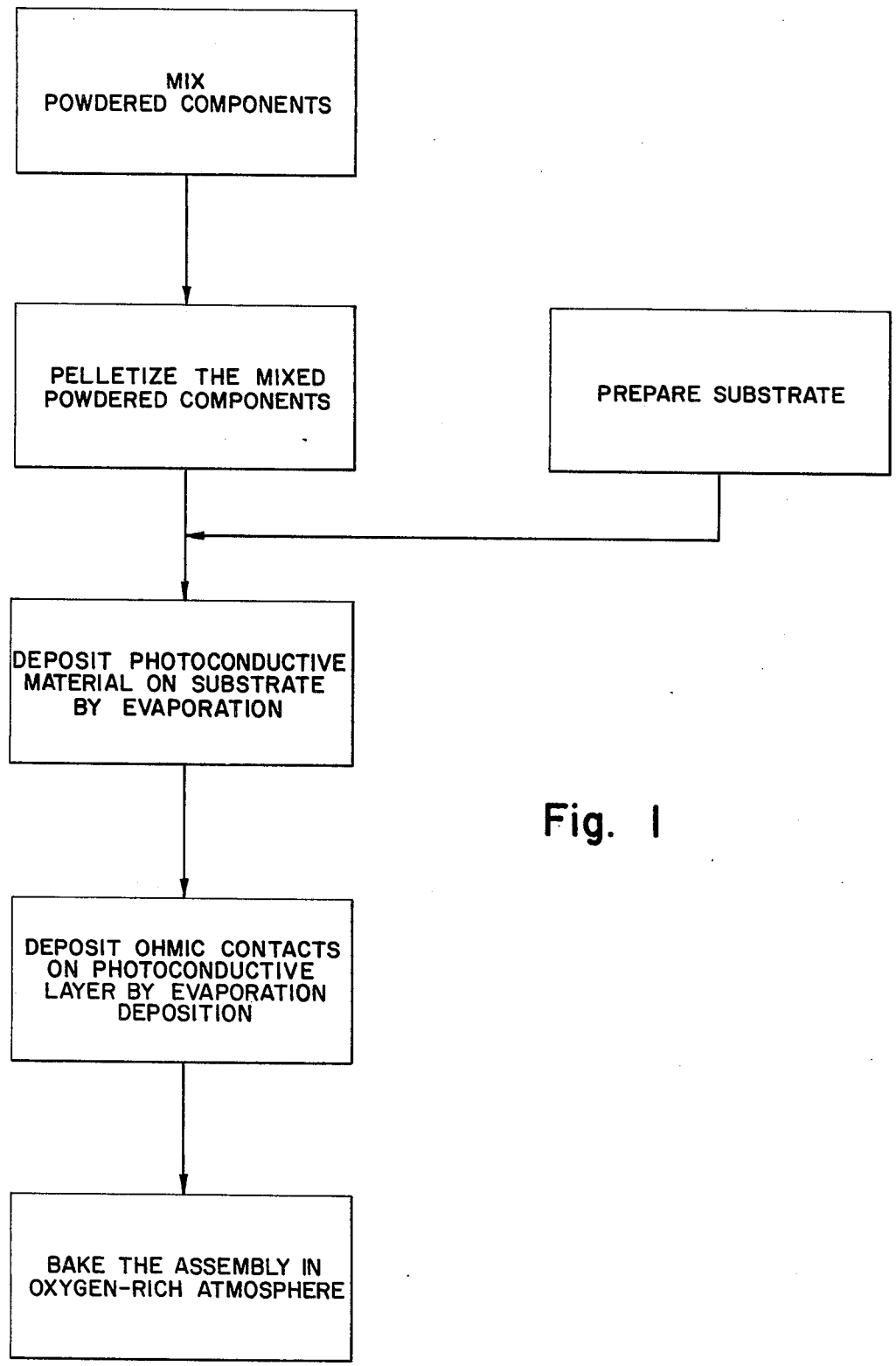

Referring to the FIGURE, powders of component materials for making the photoconductive layer are first mixed. The specific materials used for the compounds will vary with the composition desired for the photoconductive layer.

Typically, for a zinc sulfide photoconductive layer, zinc sulfide (ZnS) powder is used as the component material; for a cadmium sulfide photoconductive layer, cadium sulfide (CdS) powder is used as the component material; for cadmium selenide photoconductive layer, cadium selendide (CdSe) powder is used as the component material; for cadmium telluride photoconductive layer, cadium telluride (CdTe) powder is used as the component material; for zinc sulfide selenide photoconductive layer, zinc sulfide (ZnS) and zinc selenide (ZnSe) powders are used as the component materials; for cadmium sulfide selenide photoconductive layer, cadmium sulfide (CdS) and cadmium selenide (CdSe) powders are used as the component materials; and for cadmium sulfide telluride photoconductive layer, cadmium sulfide (CdS) and cadmium telluride (CdTe) powders are used as the component materials.

Also included in the powdered mixture is a copper halide powder and specifically copper chloride (CuCl), copper bromide (CuBr) and/or copper iodide (CuI) powder. The copper halide powder is incorporated into the mixture in such ratio that it comprises between about 0.1 and 5.0% by weight and preferably between about 0.1 and 2.0% by weight of the total mixture.

Second, the powdered mixture is then pelletized by cold pressing in a cold forming die of a suitable composition such as tungsten carbide. The die is prepared by cleaning with an acetone or the like to eliminate impurities and contaminants from the surfaces. The pellets thus formed are typically on the order of $\frac{1}{2}$ inch in diameter and $\frac{3}{4}$ inch in length. Hot pressing during pelletizing is avoided because of the risk of diffusing impurities from the die surfaces into the pellets. For this reason, the temperatures during the pressing operations are preferably kept below about 100° C.

No binders are used during pelletizing. The pellets are coalesced simply by the forming of pressure on themselves. In addition, it is preferred that the density of the formed pellets be high, particularly where the evaporation is to be done with an electron beam.

Third, concurrently with the mixing and pelletizing steps, a suitable substrate is prepared for vapor deposition of a photoconductive layer thereon. The substrate may be any material appropriate for thin-film semiconductor devices. The substrate may be a rigid material such as quartz, glass, sapphire, spinel or silicon, on which an epitaxial, polycrystalline or single-crystal seminconductor layer may be applied. Alternatively, the substrate material may be a flexible material such, for example, as paper, polyethylene terephthlate, sold commercially under the trademark Mylar; esters and ethers of cellulose such as ethyl cellulose, cellulose acetate, and cellulose nitrate; regenerated cellulose such as cellophane; polyvinyl chloride; polyvinyl chloride-acetate; polyvinyldiene chloride, sold commerically under the trademark Saran; nylon film; polyimide and polyamide-imide films; polytetrafluoroethylene, sold commercially under the trademark Teflon, polytrifluoromonochloroethylene, sold commercially under the trademark Kel F; and flexible tapes and foils of the metals: nickel, aluminum, copper, tin, tantalum and base alloys of any of these, and ferrous base alloys such for example as thin gauge stainless steel strip. Further, the paper may be of any type and surface texture, either rough or smooth, as for example, rag paper, wood pulp paper, alpha cellulose paper, kraft paper and the like. As illustrations, playing card stock, writing stationery, and newspaper script can be used for the substrate material.

Preferably, however, the substrate is an anodized aluminum foil, or is a substrate with an anodized aluminum layer thereon where the photoconductive layers or pads are to be formed. For the reason, the present method is particularly useful in making silicon-on-sapphire devices.

The substrate is prepared for vapor deposition in accordance with the present invention by cleaning by one of the various well known standard techniques which will vary with the composition of the substrate. For example, if the substrate to be used is paper or a cellulose compound, it is cleaned by blowing dry nitrogen over it and baking in an oven for approximately 30 minutes at about 100° C. Or, if the substrate is an anodized metal foil or a cured resin coating on a metal foil, or any of the other suitable flexible materials listed above, the substrate is first washed in methanol (or in another organic solvent if it happens to be soluble in methanol), dried with dry nitrogen, and baked in an oven for approximately 30 minutes at about 100° C. In any case, the prepared substrates are preferably stored in dry nitrogen atmosphere to avoid contamination prior to vapor deposition.

At least one pellet of said powdered mixture and the prepared substrate are then disposed in a standard vacuum chamber appropriate for evaporation deposition, see Holland, *Thin Film Microelectronics*, p. 236 (1965). The substrate and pellet are disposed in a spaced relationship of a known distance, e.g. 10 to 30 centimeters. Then a partial vacuum of typically less than about $1 \times 10^{-5}$ torr is established in the vacuum chamber by a standard oil diffusion, vacuum pump.

Fourth, the disposed pellet is evaporated to form a vapor which is then deposited on the substrate. The evaporation and deposition is done at a rate greater than about 10 nanometers per minute and preferably greater than about 500 nanometers per minute to avoid the inclusion of impurities in the photoconductive layer as well as to speed the deposition step. The thickness of the layer during evaporation was recorded with a crystal sensor such as a Sloan crystal microbalance. The evaporation may be done by any suitable standard means such as resistance or HF induction heating in an inert evaporation boat such as platinum, molybdenum, or refractory-lined metal, or a water-cooled hearth, see Holland, *Thin Film Microbalance*, pp. 231–39 (1965). Further, the evaporation can be done by electron bombardment of the source with a standard electron gun, such as that made by Brad Thompson.

Preferably, the deposition on the substrate is done through a metallic mask so that the photoconductive layer is formed only on those portions of the substrate where the layer is ultimately desired. Subsequently, at a convenient stage in the formation of the integrated circuit, the photoconductive layer can be more precision dimensioned, if desired, by known photo- or electro-lithographic and etch techniques. Typically, the evaporation deposition is continued until the photoconductive layer is between 1 and 5 microns in thickness.

Fifth, ohmic contacts are then preferably applied to the photoconductive layer. This step may be performed by evaporation deposition of a suitable metal such as indium-tin alloy or gold through a different metallic mask. Alternatively, the contacts may be formed by evaporation deposition over all exposed portions of the photoconductive layer and the substrate, and subsequent selective removal of the contact layer by suitable known photo- or electro-lithographic and etch techniques. Optionally, the ohmic contacts may be applied to the photoconductive layer at some convenient later stage in the manufacture of the integrated circuit.

Sixth, the assembly, which may or may not include the ohmic contacts, is removed from the vacuum chamber and subsequently disposed in an oxygen-rich atmosphere, preferably stagnant air, in a furnace where the assembly is baked at a temperature between 300° and 550° C. This baking is believed to diffuse some of the halide donor and copper acceptor dopant into the crystal structure of the photoconductive layer and allow the excess metal halide to escape from the photoconductive layer. In any event, the baking is an essential step; however, it may be performed in as little as about one to two minutes where the temperature is, as is preferred, between 400° and 550° C and most desirably about 450° C. Temperatures higher than 550° C have been found to result in too much oxidation, and temperatures below 300° C have been found impractical in that too long a time is required to dope the photoconductive layer. The length of time required for the baking step will vary inversely with the temperature because the time is related exponentially to the reciprocal of temperature.

Thin-film devices and integrated circuits can be subsequently formed adjacent and around the photoconductive layers and pads. Subsequent processing in a vacuum and heating to 350° C in nitrogen or argon, as is done in thin-film device manufacture, does not affect the photoconductive layers and pads. It should also be noted that with monolithic, hybrid or thin-film silicon integrated circuits, the integrated circuit may be formed before deposition and baking of the photoconductive layers.

To illustrate the present invention, cadmium sulfide selenide photoconductive layers were made in accordance with the present method. 10 grams of cadmium sulfide powder (G.E. luminenscence grade), 15 grams of cadmium selenide (G.E. luminescence grade), and 0.3 gram of copper chloride (commercial grade) was mixed by mortor and pestle. The powdered mixture was then cold-pressed into pellets with a tungsten carbide die with 6000 pounds press pressure. A pellet thus formed (½ inches dia. × ⅜ inches) was then disposed in a vacuum chamber and spaced 30 centimeters from an anodized aluminum substrate prepared for vapor deposition, and a partial vacuum drawn on the chamber to about 5 × $10^{-5}$ torr. The pellet was then rapidly evaporated by resistance heating as above described and vapor therefrom deposited on the cold substrate at a rate of about 1 micrometer/min.

A photoconductive layer of 1 micrometer in thickness was thus formed on the anodized aluminum substrate in about 1 minute. Ohmic contacts were then formed to the resulting brown photoconductive layer by evaporation and deposition of gold on the photoconductive layer and substrate through a different standard metallic mask. The assembled structure was then removed from the vacuum chamber and baked in stagnant air at 450° C for 1 to 2 minutes.

The photoconductivity of the photoconductive layer was then measured. Specifically, the resistance of the layer between the ohmic contacts was measured with a 2 volt potential both without illumination and with illumination of the photoconductive layer with a microscope lamp at 5 cm. distance. The dark-to-light resistance ratio was found to be between $1 \times 10^4$ and $1 \times 10^6$. It was, therefore, concluded that the photoconductive layer had a sufficient sensitivity to incandescent light for a high photoconductivity gain.

The present invention also provided a new understanding of how photoconductivity of polycrystalline layers results. The photoconductivity is believed to take place at the intergranular contacts or interfaces. During baking, most of the volatile halogen donor dopant escapes from the layer, leaving behind uncompensated copper acceptor dopant and causing the energy bands at the grain boundaries to bend upward. Further, by baking, oxygen is chemically bonded to the grains at the interfaces, which stabilizes the photoconductivity against ambient influence. The interior of the grains of the photoconductive layer are highly N-type semiconducting and not photoconducting. Further, it is believed that the copper halogen (i.e. CuCl, CuBr, and CuI) are important as the dopant compound because of the similarity in lattice structure to the photoconductive materials.

While presently preferred embodiments have been shown and described with particularity, it is distinctly understood that the invention may be otherwise variously performed within the scope of the following claims.

What is claimed is:

1. A method of making a photoconductive layer for a semiconductor device comprising the steps of:

A. mixing at least one powder of a photoconductive material selected from the group consisting of zinc sulfide (ZnS), cadmium sulfide (CdS), cadmium selenide (CdSe), and cadium telluride (CdTe), with a copper halide powder, where the copper halide powder is between about 0.1 and 5.0% by weight of the total mixture;

B. forming at least one cohesive pellet from the powdered mixture;

C. disposing at least one said pellet of said powdered mixture along with a semiconductor substrate prepared for vapor deposition thereon in spaced relationship in a partial vacuum;

D. evaporating material from said pellet to form a vapor and depositing said vapor on the semiconductor substrate at a rate greater than about 10 nanometers per minute to form a photoconductive layer on the semiconductor substrate, said photoconductive layer comprising at least one composition selected from the group consisting of zinc sulfide (ZnS), cadmium sulfide (CdS), cadmium selenide (CdSe), cadmium telluride (CdTe), zinc sulfide selenide ($ZnS_xSe_{1-x}$), cadmium sulfide selenide ($CdS_xSe_{1-x}$), and cadmium sulfide telluride ($CdS_xTe_{1-x}$) wherein $x$ is greater than zero and less than one; and E. baking the photoconductive layer and substrate in an oxygen-rich atmosphere at a temperature between 300° and 550° C for about 1 to 2 minutes.

2. A method of making a photoconductive layer for a semiconductor device as set forth in claim 1 wherein: the mixing step provides a powdered mixture including between about 0.1 and 2.0 percent by weight of the total mixture of copper chloride powder.

3. A method of making a photoconductive layer for a semiconductor device as set forth in claim 1 wherein: the baking step is performed at a temperature between 400° and 550° C.

4. A method for making a photoconductive layer for a semiconductor device as set forth in claim 1 wherein: the evaporation step is performed at a rate greater than about 500 nanometers/minute in a partial vacuum of less than about $1 \times 10^{-5}$ torr.

5. A method for making a photoconductive layer for a semiconductor device as set forth in claim 4 wherein: the mixing step provides a powdered mixture including between about 0.1 and 2.0 percent by weight of the total mixture of copper chloride powder.

6. A method for making a photoconductive layer for a semiconductor device as set forth in claim 5 wherein: the baking step is performed at a temperature between 400° and 550° C.

* * * * *